United States Patent [19]
Bienz et al.

[11] Patent Number: 5,446,423
[45] Date of Patent: Aug. 29, 1995

[54] DIGITAL SINGLE SIDEBAND MODULATOR AND METHOD

[75] Inventors: Richard A. Bienz; Lansing M. Carson, both of Chandler; Marty K. Siemon, Phoenix, all of Ariz.

[73] Assignee: Motorola, Inc., Schaumburg, Ill.

[21] Appl. No.: 308,788

[22] Filed: Sep. 19, 1994

[51] Int. Cl.[6] ............... H03C 1/60; H04L 27/04
[52] U.S. Cl. .................... 332/170; 375/301; 455/109
[58] Field of Search ............ 332/103, 104, 144, 145, 332/170, 171; 375/41–43, 61; 455/108, 109, 47

[56] References Cited

U.S. PATENT DOCUMENTS

| | | | |
|---|---|---|---|
| 3,868,601 | 2/1975 | MacAfee | 332/45 |
| 3,909,750 | 9/1975 | Brady | 332/104 |
| 4,327,439 | 4/1982 | Gockler et al. | 375/42 X |
| 4,644,565 | 2/1987 | Seo et al. | 375/61 X |
| 4,686,688 | 8/1987 | Chung et al. | 332/104 X |
| 4,974,236 | 11/1990 | Gurcan et al. | 455/109 X |
| 5,048,058 | 9/1991 | Kaleh | 375/47 |
| 5,115,468 | 5/1992 | Asahi et al. | 381/31 |
| 5,121,412 | 6/1992 | Borth | 375/67 |
| 5,225,795 | 6/1993 | Iinuma | 332/103 X |

OTHER PUBLICATIONS

"A Digital Single Sideband Modulator" by M. K. Gurcan, A. Watteau, D. J. Goodman and M. D. James from *1988 IEEE. ISCAS '88* pp. 1811–1815.

"HSP43216 Halfband Filter" from *Harris Semiconductor*, Nov. 1993. pp. 1–18.

"Compact Single Sideband Modulator" by Samuel J. Parisi, Mitre Corporation, Bedford, Mass., from *Applied Microwave* 1992, Fall pp. 91–94, 96.

"Trellis–coded modems, Implementation of Coded Modems", by Shuzo Kato, Masahiro Morikura and Shuji Kubota, from IEEE Dec. 1991. pp. 88–93, *IEEE Communications Mag.*

"Intelligent Instrumentation For Selective Pulse Excitation In NMR Imaging", by H. Jazayeri–Rad and M. A. Browne, Dept. of Instrumentation & Analytical Science, UMIST, Manchester M60 1QD, UK 1987. *J. Phys., E: Sci, Instrum.* 20 pp. 643–648.

"Digital Implementation Of a Coherent CPM System For Mobile Radio", by Eglin, Habermann and Dzung from *IEEE 1988. ISCAS'88* p. 1815.

"A Digital Single Sideband Modulator For a Digital Radio Frequency Memory", by Capt. Thomas M. Foltz, Capt. Gregory W. Cook and Lt. Col. David E. Meer, Ph.D., *Wright Patterson AFB, Ohio. U.S. Government* work not protected by U.S. Copyright. pp. 926–932 undated.

"Design Of A 6–Bit CMOS Digital Radio Frequency Memory", by Gordon M. Kranz and Mark Mehalic from *U.S. Government* work not protected by U.S. Copyright. pp. 82–89, undated.

"VLSI Architectures For A High–Speed Tunable Digital Modulator/Demodulator/Bandpass–Filter Chip Set", by Henry Samueli, Thu–ji Lin, Robert Hawley and Steven Olafson from *IEEE* 1992. pp. 1065–1068.

*Primary Examiner*—David Mis
*Attorney, Agent, or Firm*—Frederick M. Fliegel

[57] ABSTRACT

A digital single sideband modulator (10) includes a relatively complex CMOS NCO (14) that drives a relatively simple ECL frequency translator (30). The frequency translator (30) outputs a digital signal that is converted to analog by a D/A (44) and then filtered in a bandpass filter (46) having a pass band including a frequency of twice the NCO's clock frequency. The NCO (14) generates a modulated intermediate frequency NCO signal having quadrature components. The frequency translator (30) multiplies real and imaginary components of the NCO signal by real and imaginary components of digitized SIN, COS sampling functions (48, 50). The resulting products are added together. The adding operation is performed by a multiplexer (32), whose selection input is driven at twice the carrier frequency, and the multiplying operations are performed by a selective negation circuit (34), that is driven at the carrier frequency.

21 Claims, 2 Drawing Sheets

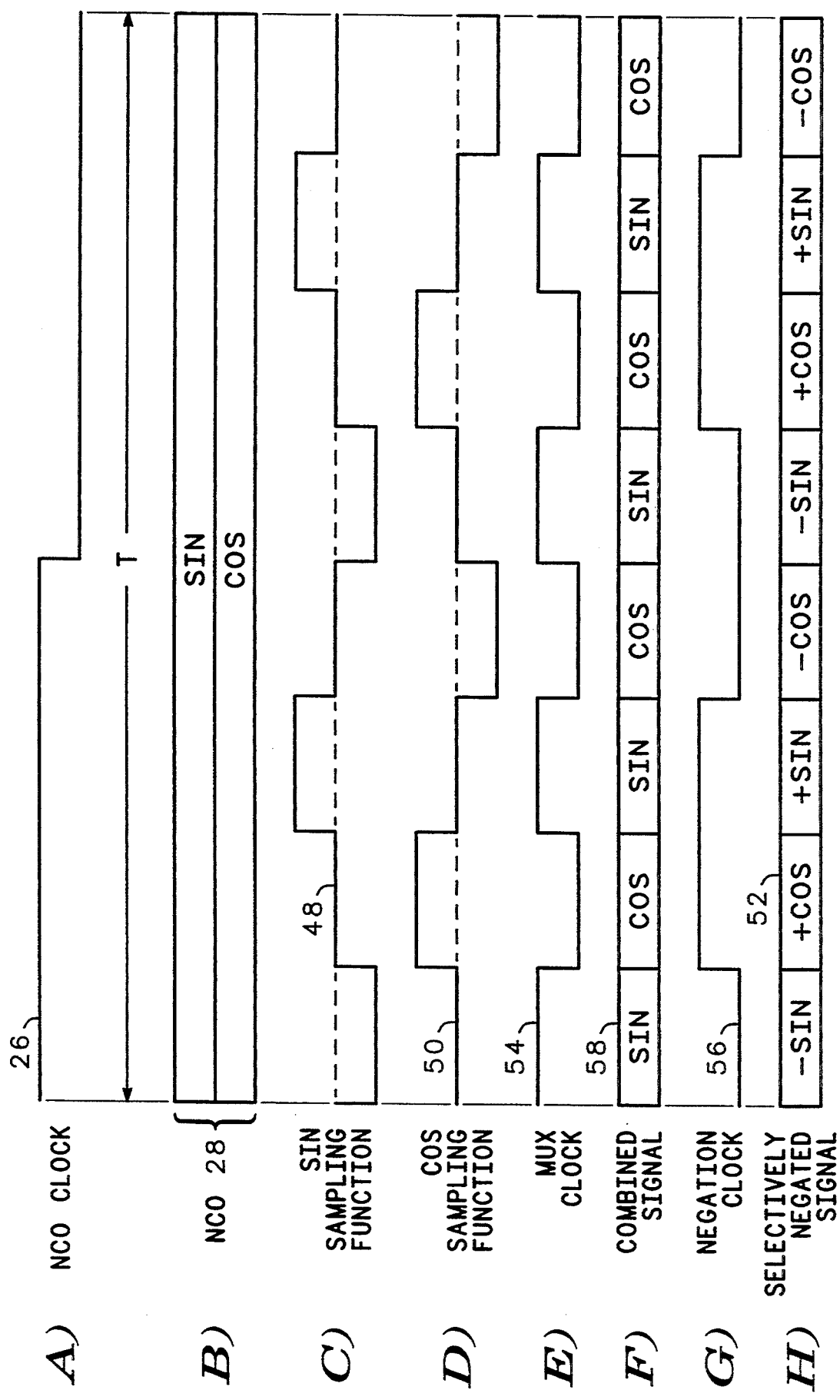

DIGITAL SINGLE SIDEBAND MODULATOR AND METHOD

LICENSE RIGHTS

The U.S. Government has a paid-up license in this invention and the right in limited circumstances to require the patent owner to license others on reasonable terms as provided for by the terms of Subcontract No. #GMS24004 pursuant to a contract awarded by the National Aeronautics and Space Administration.

TECHNICAL FIELD OF THE INVENTION

The present invention relates generally to digitally implemented single sideband modulators.

BACKGROUND OF THE INVENTION

Analog single sideband modulators are undesirable because they tend to be structurally complex, require manual alignment procedures and suffer from local oscillator (LO) leakage and distortion. In addition, they are susceptible to drift over time and temperature, and they tend to have inflexible designs that cannot readily support variety or complexity in modulating functions.

Digital modulators solve many of the problems associated with analog modulators. Generally, digital modulators use numerically controlled oscillators (NCOs) that are digitally controlled to generate a modulated signal. The modulated signal may then be up-converted as needed for transmission. Digital modulators offer great flexibility, minimize alignment procedures, are generally much less complicated and provide generally better LO leakage performance than analog modulators.

Digital modulators pose their own set of problems. One particularly vexing problem is that sampling images tend to appear in the modulated signal. Sampling images are spurious frequency components that are offset in frequency from the modulation center frequency $F_c$ by approximately the clock rate of the NCO. When the center frequency to bandwidth ratio of the modulated signal is relatively low, these sampling images are difficult to remove with realizable filters without likewise attenuating the modulated signal itself. Thus, digital modulators tend to suffer from spurious outputs.

The conventional solution to the sampling image problem is to clock the NCO at a very high frequency. This further offsets the sampling images from the center frequency $F_c$. The further the sampling images are offset from the center frequency $F_c$, the more easily they can be filtered out using realizable filters.

The conventional solution imposes a severe and undesirable impact in applications where radiation susceptibility and/or power consumption are concerns, such as in spacecraft-mounted transmitters. Often, an NCO that operates at a frequency that is high enough to permit sampling images to be removed by realizable filters must be implemented using a high speed semiconductor component, such as a GaAs semiconductor, that has poor radiation resistance and consumes a large amount of power.

SUMMARY OF THE INVENTION

Accordingly, it is an advantage of the present invention that an improved digital single sideband modulator is provided.

Another advantage is that the present invention provides a digital single sideband modulator that does not suffer from sampling images with adequate RF filtering.

Another advantage is that the present invention provides a digital single sideband modulator that does not suffer from poor radiation resistance.

Another advantage is that the present invention provides a digital single sideband modulator that does not suffer from excessively high power consumption.

The above and other advantages of the present invention are carried out in one form by a digital single sideband modulator that includes a numerically controlled oscillator (NCO) having first and second outputs and being clocked at a first frequency and an attendant method. The modulator also includes a digital frequency translator having first and second inputs coupled to the first and second NCO outputs, respectively. The digital frequency translator is clocked at a second frequency greater than the first frequency.

BRIEF DESCRIPTION OF THE DRAWING

A more complete understanding of the present invention may be derived by referring to the detailed description and claims when considered in connection with the Figures, wherein like reference numbers refer to similar items throughout the Figures, and:

FIG. 2 is a timing diagram depicting waveforms of interest with respect to the digital single sideband modulator.

DETAILED DESCRIPTION OF THE DRAWING

Figure 1:
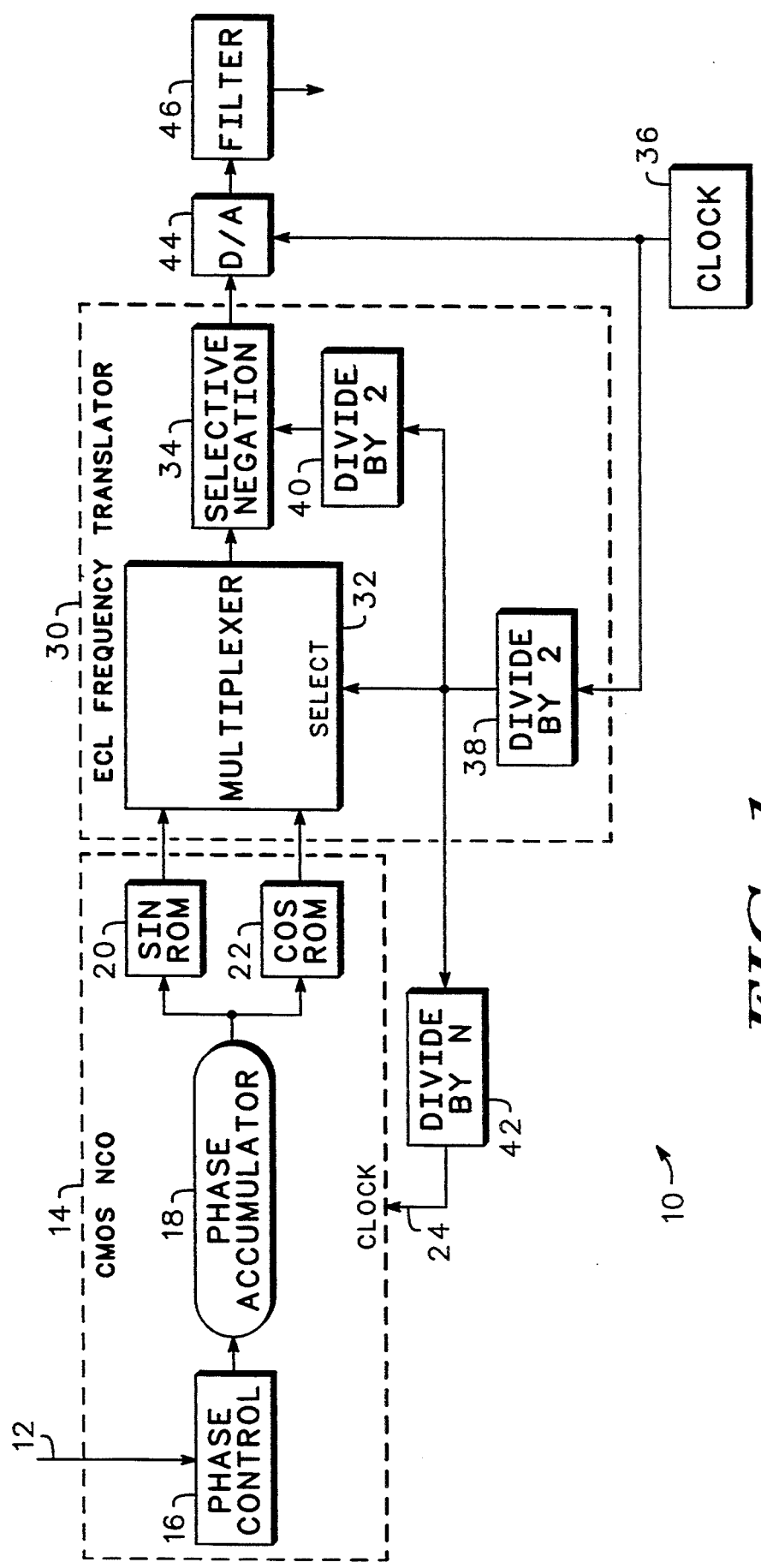
FIG. 1 is a block diagram of a digital single sideband modulator in accordance with the present invention.

FIG. 1 is a block diagram of digital single sideband modulator 10. Modulator 10 receives a digital modulating signal at input port 12. The modulating signal is characterized as a stream of digital words. Input port 12 couples to a digital control input of numerically controlled oscillator (NCO) 14. NCO 14 includes phase control circuit 16 adapted to receive the digital modulating signal and has an output that couples to an input of phase accumulator circuit 18. Phase accumulator circuit 18 keeps track of the phase angle of an oscillation signal and generates, at an output thereof, digital ]phase values that address SIN waveform read only memory (ROM) 20 and COS waveform ROM 22. Accordingly, the output waveform generated by NCO 14 represents a stream of digital samples having quadrature components. This stream of samples is digitally modulated by the signal applied at port 12. The output from SIN ROM 20 provides a real component of the NCO output signal, and the output from COS ROM 22 provides an imaginary component of the NCO output signal..

ROMs 20, 22 store binary numbers describing amplitudes of sinusoidal waveforms for various phase values. ROMs 20, 22 are configured to use a carryless negation numeration system describing sinusoidal waveform amplitudes. Carryless negation numeration systems include, for example, signed magnitude, one's complement and offset one's complement. With carryless negation numeration systems, the product of a number and the value of −1 may be derived simply through one's complement or inversion operations. In contrast, two's complement and other carry-intensive negation numeration systems form the product of a number and the value of −1 in a more complex fashion. With carry-intensive negation numeration systems either a carry bit needs to ripple throughout a binary word or carry look-ahead circuitry needs to be included to accommodate the possibility of carrying between the bits of the binary word.

NCO 14 receives a clock signal at clock input 24. FIG. 2 is a timing diagram depicting waveforms of interest with respect to modulator 10. In particular, NCO clock waveform 26 illustrates an exemplary clock signal that may be applied at clock input 24 (FIG. 1). As illustrated in NCO waveform 28, NCO clock waveform 26 causes the NCO output signal having SIN, COS components to be updated at the rate of T.

Referring back to FIG. 1, the clock signal causes NCO 14 to update its output signal at a rate greater than the rate at which the modulating signal is updated. However, the modulator 10 output signal center frequency to bandwidth ratio is relatively high.

In addition, the use of a relatively slow clock signal allows NCO 14 to be implemented using a relatively slow semiconductor technology or process. In the preferred embodiments of the present invention, NCO 14 is integrated into a complementary metal-oxide semiconductor (CMOS) application specific integrated circuit (ASIC). Thus, the frequency of the clock signal applied at clock input 24 is desirably held below 100 MHz. In a preferred embodiment, NCO 14 is clocked at 32 MHz. CMOS semiconductor processing is desirable because it exhibits excellent radiation resistance and consumes only a small amount of power when compared to faster semiconductor process technologies, e.g., GaAs.

The NCO output signals from SIN, COS ROMs 20, 22 couple to inputs of frequency translator circuit 30. In particular, the NCO output signals couple to data inputs of multiplexer 32. An output of multiplexer 32 couples to a data input of selective negation circuit 34, and an output of selective negation circuit 34 provides a digital output signal from frequency translator 30. Clock circuit 36 provides a high speed clock signal that drives frequency translator 30. Divide-by-two circuit 38 is adapted to receive the high speed clock signal. An output of divide-by-two circuit 38 couples to a selection input of multiplexer 32, an input of divide-by-two circuit 40, and an input of divide-by-N circuit 42. An output of divide-by-two circuit 40 couples to a selection input of selective negation circuit 34, and an output of divide-by-N circuit 42 provides the clock signal driving clock input 24 of NCO 14.

Digital-to-analog converter (D/A) 44 has a data input coupled to the output of frequency translator 30. A clock input of D/A 44 is adapted to receive the high speed clock signal from clock circuit 36. An output of D/A 44 couples to an input of bandpass filter 46, and an output of filter 46 provides the output for modulator 10. Of course, nothing prevents additional stages from up-converting this output signal to even higher frequencies.

Frequency translator 30 up-converts the modulated NCO signal in a manner that generates one sideband that is significantly attenuated with respect to the other sideband. Moreover, the up-conversion generally causes the sampling images generated by NCO 14 to be offset from the carrier frequency by approximately the frequency of the NCO clock. In a preferred embodiment, the high speed clock generated by clock circuit 36 runs at around 256 MHz, the clock signal that drives the selection input of multiplexer 32 runs at around 128 MHz, and the clock signal that drives selective negation circuit 34 provides the carrier frequency and runs at around 64 MHz. Divide-by-N circuit 42 divides the approximately 128 MHz clock signal by four in a preferred embodiment so that the NCO clock has a 32 MHz frequency. Consequently, sampling images at around 32 MHz and 96 MHz are easily removed from a carrier signal having a center frequency of around 64 MHz. However, those skilled in the art will appreciate that these frequency values represent only examples and that different applications can use other values.

Frequency translator 30 provides an efficient implementation of a phasing technique for single sideband modulation. Mathematically, real and imaginary quadrature components of the input signal may be multiplied by real and imaginary quadrature components of a carrier signal, respectively, and their products combined through an addition or subtraction operation to yield a single sideband signal.

Referring to FIG. 2, waveforms 48, 50 show digital SIN, COS carrier signal sampling functions. SIN, COS sampling functions represent a sinusoidal waveform that has been digitally sampled at four times the carrier frequency, and the samples are expressed using a numeration system that permits only $-1$, $+1$, and 0 values.

Following the mathematical treatment for the above-discussed phasing technique, multiplying the NCO SIN output with SIN sampling function 48 yields repetitions of the sequence: a) the negation of the NCO SIN output, b) zero, c) the NCO SIN output and d) zero. Multiplying the NCO COS output with COS sampling function 50 yields repetitions of the sequence: a) zero, b) the NCO COS output, c) zero and d) the negation of the NCO COS output. These two streams of samples may be added together to yield the sequence shown in selectively negated signal waveform 52.

Frequency translator 30 (FIG. 1) performs these multiplication and addition operations, but without generating SIN, COS sampling functions 48, 50. Rather, frequency translator 30 performs the less complex operations of generating mux clock waveform 54 and negation clock waveform 56. Waveforms 54, 56 are generated by divide-by-two circuits 38, 40 (FIG. 1), each of which may be implemented using a simple flip-flop.

Each of the above-discussed products of SIN, COS sampling functions 48, 50 with the NCO SIN, COS outputs, respectively, equals zero when the other equals a non-zero value. Thus, addition of the product waveforms may be performed by combining the SIN, COS NCO outputs in such a way that they alternate at twice the carrier frequency, that is also at a frequency greater than the NCO clock. Moreover, since the only non-zero values exhibited by sampling functions 48, 50 are $+1$ and $-1$, multiplication operations may be performed by selectively negating. A negation operation may be performed when multiplication by $-1$ is required and no operation may be performed when multiplication by $+1$ is required.

Referring to FIGS. 1, 2, to simplify implementation of frequency translator 30, the addition operation is performed before multiplication and the multiplication is performed upon a combined signal rather than on individual quadrature components of the NCO output signal. Multiplexer 32 performs the addition operation by combining the NCO SIN, COS outputs in response to mux clock waveform 54. FIG. 2 shows the resulting combined signal in waveform 58.

The multiplication operations are performed by selective negation circuit 34. The combined signal is negated in response to negation clock waveform 56 to yield selectively negated signal waveform 52. Negation clock waveform 56 causes selective negation circuit 34 to interleave negated and non-negated portions of the combined signal at the carrier frequency, which is greater than the NCO clock signal frequency but is $\frac{1}{2}$ of the frequency that drives multiplexer 32. In other words, negation clock waveform 56 causes selective negation circuit 34 to alternatively select between multiplication by a value of $-1$ and a value of $+1$. The resulting digital output signal is an up-converted single sideband signal.

The above-discussed carryless negation numeration system with which sinusoidal waveforms are expressed in SIN, COS ROMs 20, 22 simplifies the implementation of selective negation circuit 34. The use of a carryless negation numeration system allows selective negation circuit 34 to omit ripple or look-ahead carry circuits. The result is a fast multiplication operation that requires only a few circuits to implement. The preferred embodiments implement selective negation circuit 34 using Exclusive OR gates.

As illustrated by waveform 52, this up-converted single sideband signal provides updated samples at a rate of four times the carrier frequency. Thus, D/A 44 is clocked at four times the carrier frequency. Bandpass filter 46 is configured so that its pass band is centered at the carrier frequency and it has a rejection band beginning at an offset frequency approximately equal to the NCO clock frequency. Filter 46 is desirably and simply realized via conventional filter architectures because the bandwidth can be wide enough to minimize signal distortion while still providing the desired rejection. However, higher carrier frequencies may be used in other embodiments, and filter 46 may still be realized using conventional bandpass filter architectures.

In a preferred embodiment, frequency translator 30 operates at a clock rate greater than that of NCO 14. In order to accommodate the greater clock rate, frequency translator 30 is desirably implemented using a semiconductor processing technology other than the CMOS process used by NCO 14. The preferred embodiment implements frequency translator 30 in an emitter coupled logic (ECL) gate array.

ECL devices typically consume more power and are less radiation resistant than CMOS devices. However, ECL devices generally consume less power and are more radiation resistant than GaAs devices. Moreover, frequency translator 30 is a small and simple circuit compared to NCO 14 and modulator 10 in general. Multiplexer 32 may be implemented using simple well-known gate structures, selective negation circuit 34 may be implemented using one or more Exclusive OR gates, and divide-by-two circuits 38, 40 may be implemented using individual flip-flops. Consequently, any power increase or increase in radiation susceptibility has a nearly inconsequential influence on the overall performance of modulator 10.

In summary, the present invention provides an improved digital single sideband modulator. A digital modulator constructed in accordance with the teaching of the present invention offers advantages over analog single sideband modulators. These advantages included improved flexibility, minimized alignment procedures and less complicated circuits. In addition, the present invention does not suffer from significant spurious sampling images in the output. In the preferred embodiment, the frequency difference between upper and lower sampling image frequency bands approximately equals the center frequency of the modulated waveform. These spurious outputs are easily removed through a bandpass filter. The present invention does not suffer from poor radiation resistance or excessively high power consumption. The relatively complicated NCO circuits are implemented using radiation resistant, low power, CMOS semiconductor processing. Only a relatively simple frequency translator is implemented using a non-CMOS process, and it is desirably implemented in ECL.

The present invention has been described above with reference to preferred embodiments. However, those skilled in the art will recognize that changes and modifications may be made in these preferred embodiments without departing from the scope of the present invention. For example, the precise frequencies, bandwidths and the like will vary from application to application. These and other changes and modifications that are obvious to those skilled in the art are intended to be included within the scope of the present invention.

What is claimed is:

1. A digital single sideband modulator comprising:
   a numerically controlled oscillator (NCO) having first and second NCO outputs and being clocked at a first frequency; and
   a digital frequency translator having first and second inputs coupled to said first and second NCO outputs, respectively, said digital frequency translator being clocked at a second frequency greater than said first frequency.

2. A modulator as claimed in claim 1 wherein:
   said NCO is implemented using complementary metal oxide semiconductor (CMOS) processing; and
   said digital frequency translator is implemented using semiconductor processing other than CMOS.

3. A modulator as claimed in claim 1 wherein said NCO generates first and second digital quadrature NCO signals at said first and second NCO outputs, respectively, and said digital frequency translator comprises:
   combining means, coupled to said first and second NCO outputs, for combining said first and second digital quadrature NCO signals together to form a combined signal; and
   multiplying means, coupled to said combining means, for multiplying said combined signal by a sampling function.

4. A modulator as claimed in claim 3 wherein said combining means comprises adding means for adding said first and second digital quadrature NCO signals together.

5. A modulator as claimed in claim 4 wherein said adding means comprises a multiplexer configured to select between said first and second digital quadrature NCO signals.

6. A modulator as claimed in claim 5 wherein:
   said multiplexer has a multiplexer selection input; and
   said modulator additionally comprises means, coupled to said multiplexer selection input, for alternatively selecting between said first and second digital quadrature NCO signals at a rate greater than said first frequency.

7. A modulator as claimed in claim 3 wherein said multiplying means comprises a selective negation circuit.

8. A modulator as claimed in claim 7 additionally comprising alternatively selecting means, coupled to said selective negation circuit, for alternatively selecting between multiplication by a value of plus one and by a value of minus one, said alternatively selecting occurring at a rate greater than said first frequency.

9. A modulator as claimed in claim 3 wherein said multiplying means comprises means for selectively performing a one's complement multiplication by values of plus one and minus one.

10. A modulator as claimed in claim 1 wherein said digital frequency translator has a digital frequency translator output, and said modulator additionally comprises a digital-to-analog converter having an input coupled to said digital frequency translator output.

11. A modulator as claimed in claim 10 wherein said digital-to-analog converter has an output and said modulator additionally comprises a bandpass filter having a pass band including a frequency less than or equal to approximately twice said first frequency.

12. A modulator as claimed in claim 1 wherein said NCO is configured to produce samples of SIN and COS waveforms, said samples expressing said SIN and COS waveforms using a non-two's complement numeration system.

13. A method of digitally modulating an input signal to generate an output signal having a first sideband significantly attenuated relative to a second sideband, said method comprising steps of:
   generating a digitally modulated intermediate frequency signal including real and imaginary components;
   combining said real and imaginary components to produce a combined signal, said combined signal including alternate segments of said real and imaginary components; and
   selectively negating said combined signal to produce a digital output signal.

14. A method as claimed in claim 13 wherein:
   said generating step generates digital samples at a first rate; and
   said combining step causes said combined signal to alternate said real and imaginary components at a second rate, said second rate being greater than said first rate.

15. A method as claimed in claim 13 wherein:
   said generating step generates digital samples at a first rate; and
   said selectively negating step interleaves non-negated and negated portions of said combined signal, said portions being interleaved at a second rate, said second rate being greater than said first rate.

16. A method as claimed in claim 13 wherein:
   said combining step causes said combined signal to alternate said real and imaginary components at a first rate; and
   said selectively negating step interleaves non-negated and negated portions of said combined signal, said portions being interleaved at a second rate, said second rate being slower than said first rate.

17. A method as claimed in claim 13 wherein:
   said generating step generates digital samples at a first rate;
   said combining step causes said combined signal to alternate said real and imaginary components at a second rate greater than said first rate; and
   said selectively negating step interleaves non-negated and negated portions of said combined signal, said portions being interleaved at a third rate greater than said first rate and approximately one-half of said second rate.

18. A method as claimed in claim 13 wherein said generating step generates digital samples at a first frequency, and said method additionally comprises steps of:
   converting said digital output signal into an analog signal; and
   filtering said analog signal with a filter having a pass band including a frequency less than or equal to twice said first frequency.

19. A digital single sideband modulator comprising:
   a numerically controlled oscillator (NCO) configured to generate a digital intermediate frequency signal, said digital intermediate frequency signal including real and imaginary component samples updated at a first frequency;
   a multiplexer having first and second data inputs adapted to receive said real and imaginary component samples, respectively, having a multiplexer selection input, and having a multiplexer output that provides a combined signal;
   first control means, coupled to said multiplexer selection input, for alternatively selecting between said real and imaginary component samples at a second frequency, said second frequency being greater than said first frequency;
   a selective negation circuit having a first selective negation input coupled to said multiplexer output, a second selective negation input and a selective negation circuit output; and
   second control means, coupled to said second selective negation input, for causing said selective negation circuit to alternatively multiply said combined signal by a value of plus one and by a value of minus one at a rate that is greater than said first frequency and is approximately one-half of said second frequency.

20. A modulator as claimed in claim 19 wherein:
   said NCO is implemented using complementary metal oxide semiconductor (CMOS) processing; and
   said multiplexer, first and second control means and said selective negation circuit are implemented using semiconductor processing other than CMOS.

21. A modulator as claimed in claim 19 wherein said selective negation circuit has an output, and said modulator additionally comprises:
   a digital-to-analog converter having an input coupled to said selective negation circuit output; and
   a bandpass filter having a pass band including a frequency that is less than or equal to approximately twice said first frequency.

* * * * *